United States Patent
Comminges et al.

[19]

[11] Patent Number: 5,956,262

[45] Date of Patent: *Sep. 21, 1999

[54] DIGITAL FILTERING DEVICE

[75] Inventors: Martial Comminges, Grenoble; Francis Dell'ova, St. Hilaire du Touvet; Frédéric Paillardet, Grenoble, all of France

[73] Assignee: Thomson multimedia S.A., Courbevoie, France

[*] Notice: This patent issued on a continued prosecution application filed under 37 CFR 1.53(d), and is subject to the twenty year patent term provisions of 35 U.S.C. 154(a)(2).

[21] Appl. No.: 08/614,862

[22] Filed: Mar. 12, 1996

[30] Foreign Application Priority Data

Mar. 14, 1995 [FR] France ................... 9502946

[51] Int. Cl.$^6$ ........................... G06F 17/10
[52] U.S. Cl. ..................... 364/724.16; 364/724.05; 364/724.12; 364/724.13; 395/309; 395/376; 395/401; 395/500; 395/800.01
[58] Field of Search ............... 364/724.16, 724.05, 364/724.12, 724.13; 73/45.5; 375/350; 395/309, 376, 401, 500, 800, 800.01

[56] References Cited

U.S. PATENT DOCUMENTS

| | | | |
|---|---|---|---|
| 4,048,485 | 9/1977 | Nussbaumer | 73/45.5 |
| 4,118,784 | 10/1978 | Nussbaumer | 364/724.12 |
| 4,766,561 | 8/1988 | Thompson et al. | 364/724.13 |
| 5,367,540 | 11/1994 | Kakuishi et al. | 375/350 |

OTHER PUBLICATIONS

EDN Electrical Design News, vol. 28, No. 7, Mars 1983 Newton, Massachusetts, US pp. 193-193-197, J. Oxaal "DSP Hardware Improves Multiband Filters".

*Primary Examiner*—William Grant
*Assistant Examiner*—McDieunel Marc
*Attorney, Agent, or Firm*—Joseph S. Tripoli; Peter M. Emanuel; Frederick A. Wein

[57] ABSTRACT

A digital sample filtering device comprising storage device including ROM and RAM memory for storing in an interlaced manner, coefficients of at least two filters along with for each coefficient, data indicating to which of the filters the each coefficient belongs; a multiplier for multiplying at least one of the coefficients by a sample and an accumulator for adding the partial sums of the multiplication results for each of the filters.

12 Claims, 3 Drawing Sheets

DIGITAL FILTERING DEVICE

FIELD OF THE INVENTION

The invention relates to a digital filtering device within a digital signal processing system. The invention can be used notably to implement a number of digital filters in series.

DESCRIPTION OF THE RELATED ART

The implementation of digital filters often implies the use of a number of identical circuit elements resulting in a very high chip surface requirement.

SUMMARY OF THE INVENTION

It is an object of the invention to provide a digital sample filtering device comprising a storage device for storing, in an interlaced manner, the coefficients of at least two filters along with for each coefficient, data indicating to which of the filters the coefficient belongs; a multiplier for multiplying of one of the coefficients by a sample; and an accumulator for adding the partial sums of the multiplication results for each of the filters.

Such a multiplexing scheme enables a single multiplier to be used. Furthermore, the manner in which the data is stored in a ROM storage device allows the order in which the calculations are carried out to be controlled and the time of output of the filtered samples from the device to be set.

In a particular embodiment, the said storage device is a ROM containing, in an interlaced manner, the coefficients of the filters in addition to data, for each coefficient, indicating the filter to which the coefficient belongs.

It is a further object to provide a storage device which includes buffer registers, and which contains coefficients of a first and second filter in series. Still further, the device contains two RAM memories (2,3) the first of which (2) registers the samples (X1), whereas the second (3) registers the samples filtered by the first of the filters (FA).

In a particular embodiment, at least one of the filters carries out an oversampling, and the coefficients of filters following the filter which carries out an oversampling, are stored in a repeated manner in the storage device.

BRIEF DESCRIPTION OF THE DRAWINGS

The invention will be better understood and other advantages and characteristics will become clear on reading the following description of a particular embodiment, taken only as a non-limitative example, making reference to the appended figure, of which.

DETAILED DESCRIPTION OF THE INVENTION

In the present embodiment, samples at frequency $F_s$ are successively fed to two filters, FA and FB. The first filter FA is a symmetrical half-band filter, of the 133rd order type, which carries out an oversampling of factor 2. As a result of its inherent characteristics, this filter can be implemented by means of 33 coefficients. The second filter FB is a filter of the 48th order type, represented by means of 46 coefficients and which carries out an additional oversampling of factor 4. Therefore, the two filters in series oversample at a factor of 8. The principles of oversampling used by the filter are themselves well known and will not be described here.

Figure 1A:
FIG. 1 represents symbolically the oversampling carried out by the filters in the present example.
Figure 1B:
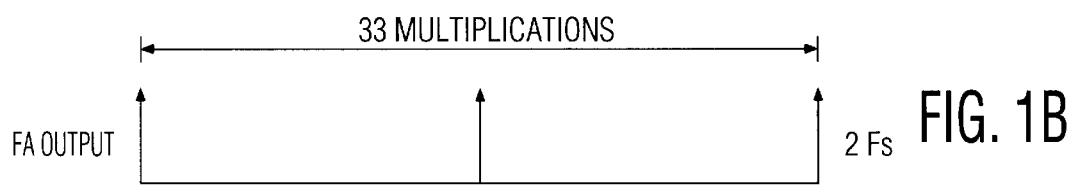
Figure 1C:
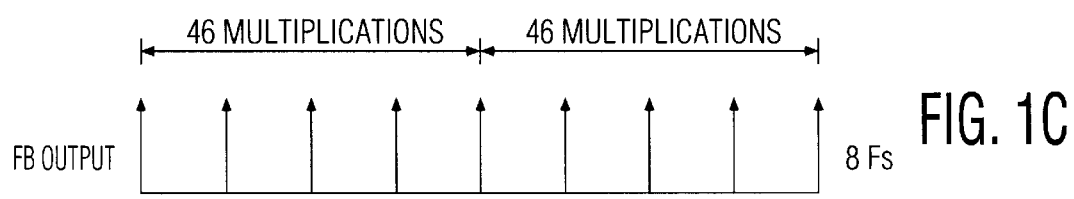

FIG. 1 illustrates the oversampling by showing two samples of the input signals and the samples during the output of the two filters FA and FB. During a period $F_s$, 33 multiplications must be carried out for the implementation of filter FA, and 2*46=92 for Th the implementation of filter FB, making a total of 125 multiplications. The circuit can therefore be operated using a clock with a frequency of at least $125*F_s$. For obvious simplification reasons, we shall choose a clocking frequency of $128*F_s$.

It should be noted that if the circuit of the present embodiment is implemented in an audio processing circuit, the clock frequency will be doubled depending on the mono or stereo nature of the signals to be processed.

The ratio between the number of multiplications to be carried out for FA and those for FB is approximately ⅓. A multiplication is carried out for FA, followed by three for FB and so on until the 46 coefficients for the filter FB are depleted. The second series of 46 coefficients is processed in the same way.

The table below shows the configuration of the coefficients in the ROM.

| Addr. | Filt. | Coef. | Addr. | Filt. | Coef. | Addr. | Filt. | Coef. | Addr. | Filt. | Coef. |
|---|---|---|---|---|---|---|---|---|---|---|---|
| 0 | A | A0 | 32 | A | A5 | 64 | B | B1 | 96 | B | B25 |
| 1 | B | B0 | 33 | B | B24 | 65 | B | B2 | 97 | B | B26 |
| 2 | B | B1 | 34 | B | B25 | 66 | A | A17 | 98 | A | A25 |
| 3 | B | B2 | 35 | B | B26 | 67 | B | B3 | 99 | B | B27 |
| 4 | A | A1 | 36 | A | A9 | B8 | B | B4 | 100 | B | B28 |
| 5 | B | B3 | 37 | B | B27 | 69 | B | B5 | 101 | B | B29 |
| 6 | B | B4 | 38 | B | B28 | 70 | A | A18 | 102 | A | A26 |
| 7 | B | B5 | 39 | B | B29 | 71 | B | B6 | 103 | B | B30 |
| 8 | A | A2 | 40 | A | A10 | 72 | B | B7 | 104 | B | B31 |
| 9 | B | B5 | 41 | B | B30 | 73 | B | B8 | 105 | B | B32 |
| 10 | B | B7 | 42 | B | B31 | 74 | A | A19 | 106 | A | A27 |
| 11 | B | B8 | 43 | B | B32 | 75 | B | B9 | 107 | B | B33 |
| 12 | A | A3 | 44 | A | A11 | 76 | B | B10 | 108 | B | B34 |
| 13 | B | B9 | 45 | B | B33 | 77 | B | B11 | 109 | B | B34 |
| 14 | B | B10 | 46 | B | B34 | 78 | A | A20 | 110 | A | A28 |
| 15 | B | B11 | 47 | B | B35 | 79 | B | B12 | 111 | B | B36 |

-continued

| Addr. | Filt. | Coef. | Addr. | Filt. | Coef. | Addr. | Filt. | Coef. | Addr. | Filt. | Coef. | Addr. | Filt. | Coef. |
|---|---|---|---|---|---|---|---|---|---|---|---|---|---|---|
| 16 | A | A4 | 48 | A | A12 | 80 | B | B13 | 112 | B | B37 | | | |
| 17 | B | B12 | 49 | B | B36 | 81 | B | B14 | 113 | B | B38 | | | |
| 18 | B | B13 | 50 | B | B37 | 82 | A | A21 | 114 | A | A29 | | | |
| 19 | B | B14 | 51 | B | B38 | 83 | B | B15 | 115 | B | B39 | | | |
| 20 | A | A5 | 52 | A | A13 | 84 | B | B16 | 116 | B | B40 | | | |
| 21 | B | B15 | 53 | B | B39 | 85 | B | B17 | 117 | B | B41 | | | |
| 22 | B | B16 | 54 | B | B40 | 86 | A | A22 | 118 | A | A30 | | | |
| 23 | B | B17 | 55 | B | B41 | 87 | B | B18 | 119 | B | B42 | | | |
| 24 | A | A6 | 56 | A | A14 | 88 | B | B19 | 120 | B | B43 | | | |
| 25 | B | B18 | 57 | B | B42 | 89 | B | B20 | 121 | B | B44 | | | |
| 26 | B | B29 | 58 | B | B43 | 90 | A | A23 | 122 | A | A31 | | | |
| 27 | B | B20 | 59 | B | B44 | 91 | B | B21 | 123 | B | B45 | | | |
| 28 | A | A7 | 60 | A | A15 | 92 | B | B22 | 124 | A | A32 | | | |
| 29 | B | B21 | 61 | B | B45 | 93 | B | B23 | | | | | | |
| 30 | B | B22 | 62 | A | A15 | 94 | A | A24 | | | | | | |
| 31 | B | B23 | 63 | B | B0 | 95 | B | B24 | | | | | | |

(Addr. = address; Filt. = Filter; Coef. = Coefficient)

AI refers to the coefficients for the first filter whilst BI refers to the coefficients for the second filter.

We note that the table contains the FB filter coefficients in a repetitive manner, these coefficients being used at a frequency of 2*Fs, given that filter FA oversamples with a factor of 2*Fs, given that filter FA oversamples with a factor of 2.

Figure 2:
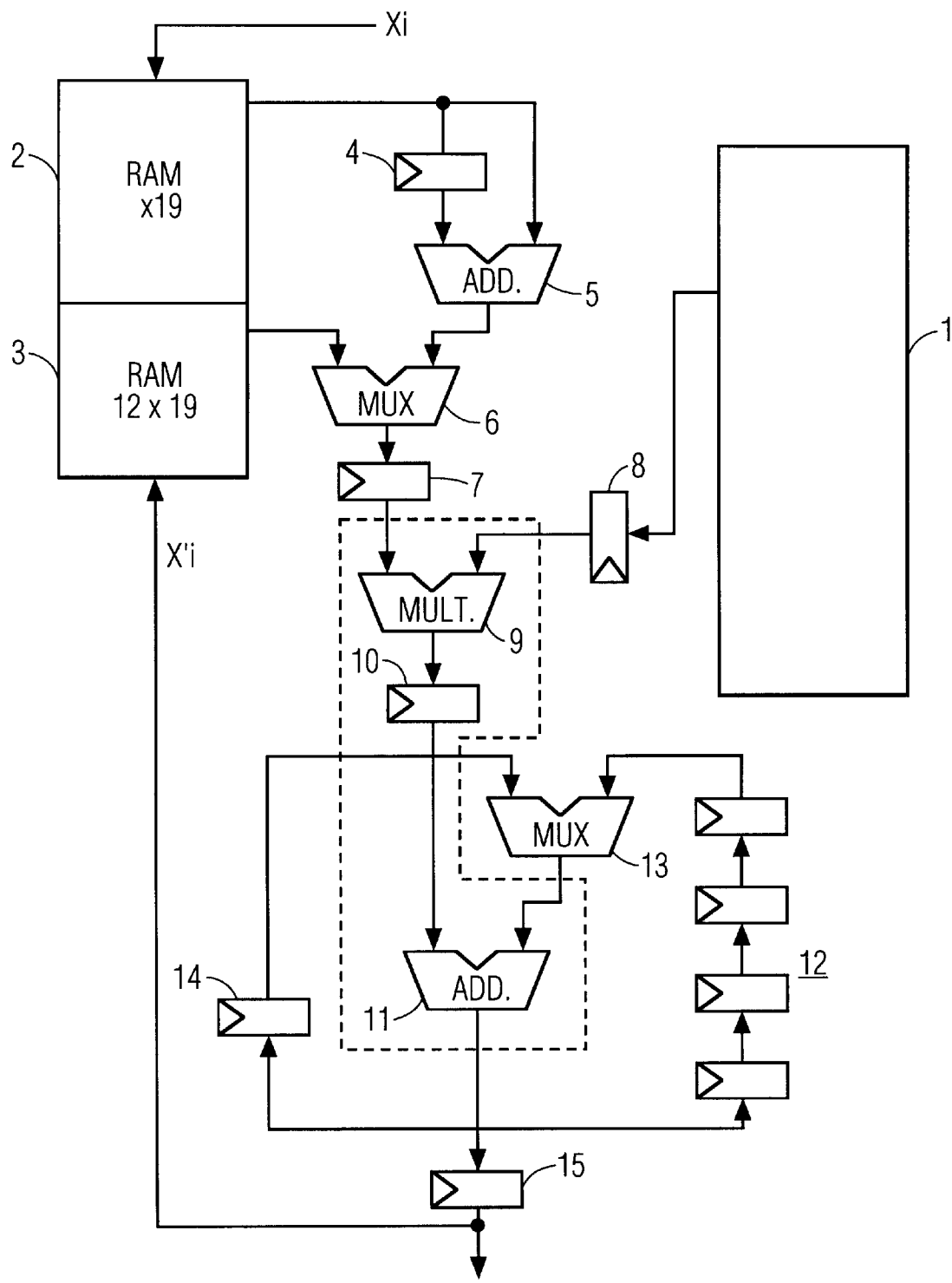
FIG. 2 represents schematically a circuit according to the invention.

FIG. 2 is a functional diagram of the circuit complying with the present ambodiment. The ROM 1 contains essentially the information in Table 1; each coefficient is coded on 17 bits. An additional bit is allocated for each coefficient in order to indicate the filter to which it belongs. The ROM 1, which therefore has a size of 125*18 bits, is read sequentially. The filter identification bit determines the different multiplexings carried out in the rest of the circuit. The contents of the ROM forms a sequencing program for the operations within the circuits.

The circuit in FIG. 2 also includes a RAM 2, which registers the samples input in the FA (XI samples). The samples are coded on 19 bits, RAM 2 registers 67 samples for filter FA whilst RAM 3 registers 12 for filter FB, given the oversamplings that are carried out.

Given the symmetrical nature of filter FA, a first sample read in memory 2 is memorized in buffer register 4; a second sample is read in order to be added to the first, by means of adder 5. This sum of coefficients is then multiplexed, by a multiplexer, with one of the samples read from RAM 3. The multiplexer is controlled by the status of the identification bit in the filter read from ROM 1. Multiplexer 6 output is memorized in buffer register 7, whilst the coefficient read from ROM 1 is memorized in buffer register 8.

The contents of buffers 7 and 8 are multiplied by a multiplier 9, the result is then stored in buffer register 10 to be added, by adder 11, to the partial sum already carried out for the filter to which it corresponds.

The partial sum corresponding to filter FA is stored in buffer register 14. For reasons explained later (as the null coefficients and the filter's central coefficient are not stored in ROM 1), the circuit shown in FIG. 2 only calculates one result in two for filter FA. For this reason, only one buffer register is used at this point.

Filter FB supplies four results per half-period of $F_s$, in other words for 46 multiplications. These four results are stored in shift register 12, made up of four buffer registers in series. These four results correspond to the partial sums which are cumulated during the calculations carried out for the last four coefficients (42 to 45) for filter FA.

These results are moving in series once the calculation has been carried out for the last coefficient.

Shift register 12 also loops onto multiplexer 13. As for multiplexer 6, multiplexer 13 is controlled, during the multiplication phases, by the status of the filter's identification bit. The two buffers, 12 and 14, receive the output from adder 11. All final results from either of the filters are stored in buffer 15. When the result belongs to filter FA, it is stored in RAM 3 to be used later on by filter FB. The results output from filter FB are available as output from buffer 15.

Figure 3:
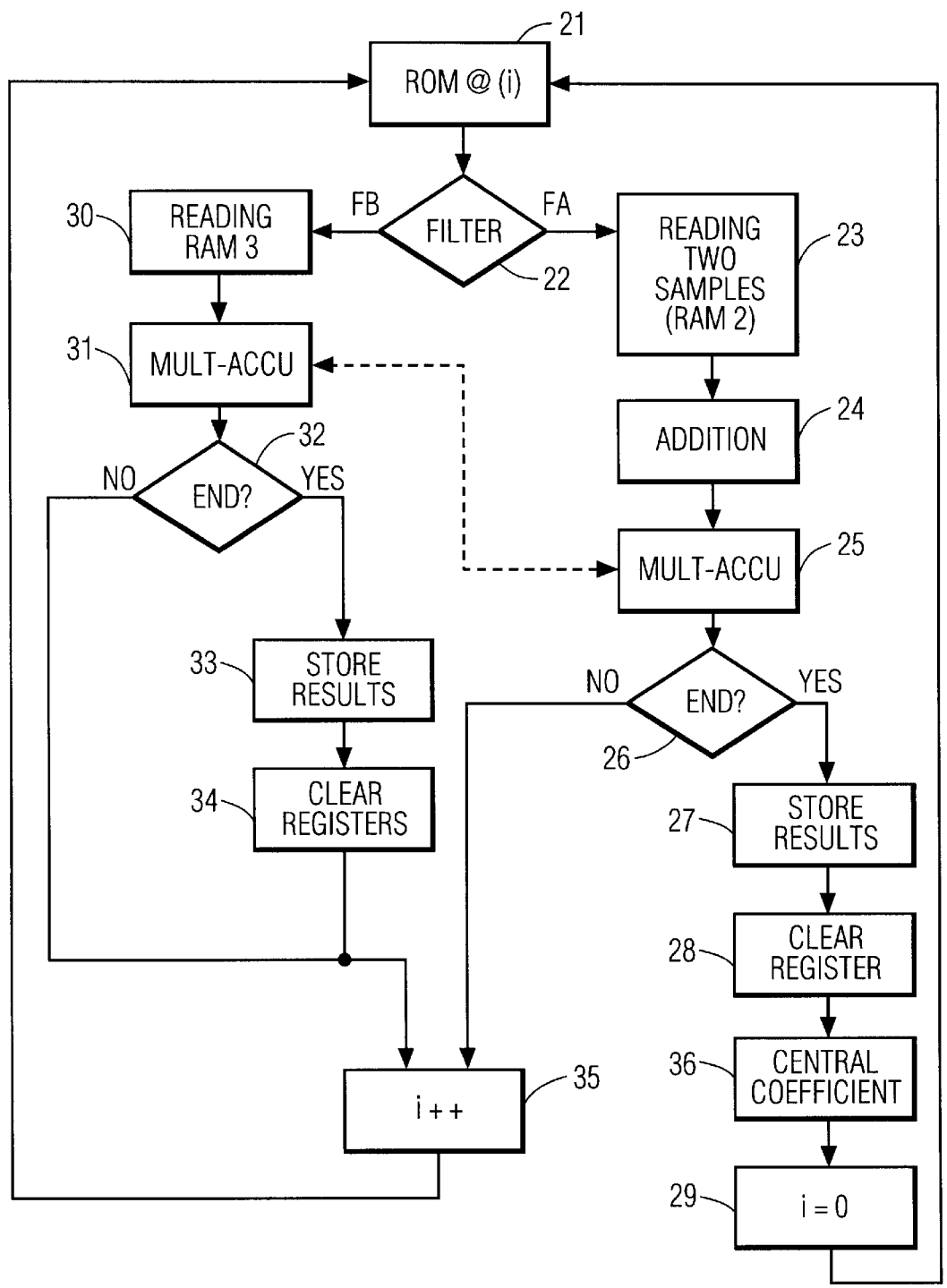
FIG. 3 is a block diagram illustrating the operation of the circuit shown in FIG. 2.

FIG. 3 is a block diagram showing the operation of the circuit shown in FIG. 2. To simplify the explanation, the processing of the two filters has been artificially separated. Index I corresponds to the order index for the coefficients in ROM 1; @(I) is the address of coefficient I.

In the present embodiment, the circuit is controlled by a microprocessor which is not shown.

The first step (21) consists in reading ROM 1 at address @(I), Index I having already been initialized to the appropriate value. The identification bit, for the filter for coefficient I, is tested during step 22 (coefficient AI for filter FA and BI for filter FB). Steps 23 to 29 refer to the first filter, whilst steps 30 to 33 refer to the second filter.

Step 23 refers to the reading of two samples in RAM 2. These are the two "symmetrical" samples which correspond to coefficient AI, filter FA being a symmetrical filter. These two coefficients are then added during step 24, multiplied by AI, the result is then added to the artiad sum in progress. Step 26 tests to see whether the last coefficient of FA has been processed.

If this is the case, the result of the final cumulation is stored in RAM 3, shift register 12 is reset to zero, Index I is also reset (steps 27 to 29 respectively) and the reading of ROM 1 is restarted. If this is not the case, I is incremented (step 35) and the reading of ROM 1 continues.

Step 30 corresponds to the reading of a sample of RAM 3 for the calculation corresponding to filter FB. The sample is multiplied by BI and cumulated with the corresponding partial sum which has already been calculated. A test is then carried out (step 32) to ensure that BI corresponds to a last coefficient (45) of FB. If this is the case, the four results of the successive cumulations are transmitted to the circuit output and cumulation register 14 is reinitialized. If this is not the case, I is incremented and the reading of ROM 1 continues.

The dotted double arrow in the diagram of FIG. 3 shows that steps 25 and 31 are carried out by the same circuit element.

Filter FA is, in the present case, a filter whose central coefficient is not null. This is the only non-null coefficient. A result of the oversampling of a factor two on the input of filter FA is that every second result output from the filter results solely from the multiplication of this central coefficient by a sample, all the other multiplications having a null result. In fact, if the sequence of the samples is:

$x_0, x_1, x_2 \ldots,$ then filter FA processes:

$x_0, 0, x_1, 0, x_2, 0 \ldots,$

However, the coefficients for the filter are of type:

$C_0, 0, C_2, 0 \ldots 0, {}_{central-1}, {}_{central+1}, 0 \ldots, C_n$

Initially, the following result is calculated:

$C_0 x_0 + C_2 x_1 + \ldots$

During the second alternation, the following calculation must be carried out.

$C_0 * 0 + 0 * x_1 + C_2 * 0 + \ldots +_{central} * x_i \ldots 0 * x_n$

Only $_{central} * x_i$ is not null.

As a result, only one alternation in two is calculated by using the interlacing indicated. The case of the central coefficient is dealt with separately during step 36 in order to avoid a large umber of useless calculations being carried out by multiplier 9. The microprocessor (or equivalent) carries out the calculation and registers the results in RAM 3.

Of course, the invention is not limited to the embodiment described above. It can also be applied to a greater number of filters and to cases where there is no oversampling. Furthermore, the filters are not necessarily in series but can be arranged in parallel.

In a particular embodiment, a single RAM is provided for the two filters, which enables the addressing to be simplified.

What is claimed is:

1. Digital sample filtering device comprising:
   storage means for storing, in an interlaced manner, coefficients of at least two filters along with, for each coefficient, data indicating to which of the said filters said coefficient belongs;
   means for multiplication of one of said coefficients by a sample;
   means for cumulation of the partial sums of the multiplication results for each of said filters.

2. Device according to claim 1, wherein said storage means is a ROM.

3. Device according to claim 1, wherein said multiplication means include a single multiplier.

4. Device according to claim 1, wherein said cumulation means include buffer registers.

5. Device according to claim 1, wherein said storage means memorize the coefficient from a first and second filter in series.

6. Device according to claim 5, further comprising two RAM memories the first of which registers the said samples whilst the second registers the samples filtered by the first of said filters.

7. Device according to claim 1, wherein each coefficient stored in the said storage means is read sequentially, said coefficient being multiplied by one of the said samples, the said data indicating to which filter a coefficient belongs determining by which cumulation means the result of the multiplication will be cumulated.

8. Device according to claim 1, wherein once the calculations resulting to a given filter have been carried out, all results cumulated in said cumulation means are cleared from said means.

9. A digital sample filtering device comprising:
   storage means for storing, in an interlaced manner, coefficients of at least two filters along with, for each coefficient, data indicating to which of the said filters said coefficient belongs;
   means for multiplying one of said coefficients by a sample, and
   means for cumulation of the partial sums of the multiplication results for each of said filters,
   at least one of the two filters carrying out an oversampling.

10. Device according to claim 9, wherein the coefficients of said filters, following said at least one filter that carries out an oversampling, are stored in a repeated manner in said storage means, said storage means comprising a single ROM.

11. A digital sample filtering device comprising:
    storage means for storing, in an interlaced manner, coefficients of at least two filters along with, for each coefficient, data indicating to which of the said filters said coefficient belongs;
    means for multiplying one of said coefficients by a sample, and
    means for cumulation of the partial sums of the multiplication results for each of said filters,
    null coefficients for a symmetrical filter not being stored.

12. Device according to claim 11, wherein the central non-null coefficient for a symmetrical filter is not stored in the said storage means, the calculations concerning said central coefficient being carried out separately.

* * * * *